(12) United States Patent
Lin et al.

(10) Patent No.: US 7,345,504 B2
(45) Date of Patent: Mar. 18, 2008

(54) IMPEDANCE ADJUSTABLE CIRCUIT HAVING ON-CHIP ADJUSTABLE TERMINATION RESISTOR

(75) Inventors: Joanna Lin, Taipei (TW); Lester Yeh, Taipei (TW)

(73) Assignee: Via Technologies, Inc., Taipei (TW)

( * ) Notice: Subject to any disclaimer, the term of this patent is extended or adjusted under 35 U.S.C. 154(b) by 21 days.

(21) Appl. No.: 11/465,636

(22) Filed: Aug. 18, 2006

(65) Prior Publication Data

US 2007/0040716 A1 Feb. 22, 2007

Related U.S. Application Data

(60) Provisional application No. 60/709,974, filed on Aug. 19, 2005.

(51) Int. Cl.
*H03K 17/16* (2006.01)
(52) U.S. Cl. .......................... 326/30; 326/86; 327/108
(58) Field of Classification Search ................. 326/30, 326/86; 327/108
See application file for complete search history.

(56) References Cited

U.S. PATENT DOCUMENTS

| | | | | |
|---|---|---|---|---|
| 5,235,222 A | * | 8/1993 | Kondoh et al. | 326/83 |
| 6,307,791 B1 | * | 10/2001 | Otsuka et al. | 365/189.05 |
| 6,570,402 B2 | * | 5/2003 | Koo et al. | 326/30 |
| 6,690,211 B1 | * | 2/2004 | Huang et al. | 327/108 |
| 6,947,336 B2 | * | 9/2005 | Kim et al. | 365/189.05 |
| 6,949,949 B2 | * | 9/2005 | Lundberg | 326/30 |
| 7,170,318 B2 | * | 1/2007 | Kim et al. | 326/83 |

* cited by examiner

*Primary Examiner*—Vibol Tan
(74) *Attorney, Agent, or Firm*—Kirton & McConkie; Evan R. Witt

(57) ABSTRACT

An adjustable termination resistor includes a reference resistor, a current mirror circuit, a calibration transistor-resistor array, a digital code generator, a comparator, a decision and latch circuit and a termination resistor. The mirror current generated from the current mirror circuit flows through the calibration transistor-resistor array to result in a comparing voltage across the calibration transistor-resistor array. The resistance of the calibration transistor-resistor array is determined according to a digital code generated from the digital code generator. The voltage level outputted from the comparator is changed from a first state to a second state when the digital code generator up counts to a target digital code such that the comparing voltage is just greater than the reference voltage. The decision and latch circuit records the target digital code into therein. The resistance of the termination resistor is adjustable according to the target digital code.

10 Claims, 3 Drawing Sheets

IMPEDANCE ADJUSTABLE CIRCUIT HAVING ON-CHIP ADJUSTABLE TERMINATION RESISTOR

CROSS REFERENCE TO RELATED PATENT APPLICATION

This patent application claims the benefit of U.S. provisional patent application No. 60/709,974, filed Aug. 19, 2005.

FIELD OF THE INVENTION

The present invention relates to an impedance adjustable circuit, and more particularly to an impedance adjustable circuit having an on-chip adjustable termination resistor for use in an integrated circuit chip.

BACKGROUND OF THE INVENTION

Nowadays, many electrical appliances are widely used with personal computers due to the amazing power of the personal computers. With the processing speed of the personal computer is increased, the bus transmission interface used with the personal computer has a high transmission speed. An example of the bus transmission interface includes a universal serial bus (USB), a PCI Express (PCIe) interface, a serial advanced technology attachment (SATA) bus, and the like. For achieving optimum impedance match of the transmission line, a termination resistor is usually mounted on the high speed transceiver of the high-speed bus transmission interface to avoid the return loss resulting from the mismatch. As a consequence, the problem of causing distorted signals upon transmission is overcome.

Conventionally, the off-chip termination resistor can meet the above requirements of the transceiver. However, the cost and the reliability of the off-chip termination resistor are not satisfactory. Recently, on account of cost-effectiveness and reliability, an embedded chip which is also called system on chip (SOC) is developed. Consequently, an on-chip termination resistor is also developed.

Referring to FIG. 1, a schematic circuit diagram of a chip having an on-chip termination resistor implemented by an analog adjustment technology is illustrated. As shown in FIG. 1, a metal-oxide-semiconductor (MOS) transistor 10, an operational amplifier 11 and a voltage divider 12 are mounted on the chip 1. The MOS transistor 10 is served as the on-chip termination resistor (Rmos). An external resistor Rext is also electrically connected to the chip 1. By regulation of the operational amplifier 11 and the voltage divider 12, the relation between the resistance Rext of the external resistor and the resistance Rmos of the MOS transistor 10 is deduced as: Rext/Rmos=2R/R. For example, if the resistance Rext of the external resistor is 100 ohms, the resistance Rmos of the MOS transistor 10 is 50 ohms.

Since the voltage Vds across the source and the drain of the MOS transistor 10 is varied during data transmission of the transceiver, the resistance Rmos of the MOS transistor 10 is non-linear. In addition, using the additional external resistor Rext as the reference resistance increases extra cost.

Referring to FIG. 2, a schematic circuit diagram of a chip having an on-chip termination resistor implemented by a digital adjustment technology is illustrated. The chip 2 includes a transistor-resistor array 20, an internal current source 21, a reference voltage source Vref, two low pass filters 220, 221, a comparator 22, a digital code generator 23 and a register 24. A digital code generated from the digital code generator 23 is temporarily stored in the register 24. The resistance R of the transistor-resistor array 20 is determined according to the digital code stored in the register 24. Since a constant current I is outputted from the internal current source 21, the voltage V across the transistor-resistor array 20 is proportional to the resistance R of the transistor-resistor array 20, i.e. V=I×R. Accordingly, the voltage V across the transistor-resistor array 20 is varied with the digital code. The transistor-resistor array 20 and the reference voltage source Vref are electrically connected to the low pass filters 220 and 221, respectively, for filtering off the high-frequency components but retaining the low-frequency components. When the computer system is started to execute the self-examination operation, a plurality of digital codes in an ascending order are successively generated and transmitted from the digital code generator 23 to the register 24. As a consequence, the voltage V across the transistor-resistor array 20 is gradually increased until the potentials of the input terminals of the comparator 22 are equal, i.e. V=Vref. Meanwhile, the digital code stored in the register 24 denotes an optimum digital code. According to this optimum digital code, the resistance values of other transistor-resistor arrays (not shown) of the computer system can be determined.

As known, for implementing the digital adjustment, the reference voltage source Vref and the internal current source 21 should be stable and reliable. Generally, since the internal current source 21 has a variation from +/−25% to +/−30%, the resistance R of the transistor-resistor array 20 also has a variation from +/−25% to +/−30%. That is, the stability and the reliability of the internal current source 21 are not satisfactory. Moreover, the trend of designing the chip is toward low power consumption. Due to the consumption of the constant current I, the digital adjustment of FIG. 2 consumes much power.

SUMMARY OF THE INVENTION

The present invention relates to an impedance adjustable circuit having an on-chip adjustable termination resistor for use in an integrated circuit chip, thereby increasing cost-effectiveness, reliability and linearity of the termination resistor.

In accordance with an aspect of the present invention, there is provided an impedance adjustable circuit having an on-chip adjustable termination resistor for use in an integrated circuit chip. The integrated circuit chip includes a bandgap voltage reference module. The adjustable termination resistor includes a reference resistor, a current mirror circuit, a calibration transistor-resistor array, a digital code generator, a comparator, a decision and latch circuit and a termination resistor. The reference resistor is coupled to the bandgap voltage reference module, wherein a reference voltage is determined according to the reference resistor and an internal current outputted from the bandgap voltage reference module. The current mirror circuit generates a mirror current according to an external current outputted from the bandgap voltage reference module as a reference current and a factor. The calibration transistor-resistor array is electrically connected to the current mirror circuit, wherein the mirror current flows through the calibration transistor-resistor array to result in a comparing voltage across the calibration transistor-resistor array. The digital code generator is electrically connected to the calibration transistor-resistor array for generating and outputting a digital code to the calibration transistor-resistor array, wherein the resistance of the calibration transistor-resistor array is determined according to the digital code. The comparator has two input terminals electrically connected to the reference resistance and the calibration transistor-resistor array. The voltage level outputted from the comparator is changed from a first state to a second state when the digital code generator up counts to a target digital code such that the comparing voltage is just greater than the reference voltage. The decision and latch circuit is electrically connected to the comparator and the digital code generator for recording the target digital code therein. The termination resistor is electrically connected to the decision and latch circuit and includes a plurality of transistor-resistor arrays connected in parallel, wherein the resistance of the termination resistor is adjustable according to the target digital code outputted from the decision and latch circuit.

In an embodiment, the resistance of the reference resistor is equal to that of an internal resistance of the bandgap voltage reference module.

In an embodiment, the factor for determining the current mirror circuit is a ratio of the resistance of an external resistor of the bandgap voltage reference module to the resistance of the calibration transistor-resistor array in response to the target digital code.

In an embodiment, the calibration transistor-resistor array and each of the transistor-resistor arrays included in the termination resistor have identical structures.

In an embodiment, the voltage level outputted from the comparator is changed from a low-level state to a high-level state when the comparing voltage is just greater than the reference voltage.

In an embodiment, a clock signal is inputted into the decision and latch circuit.

In an embodiment, the decision and latch circuit records the target digital code therein and issues a stop signal to the digital code generator when the voltage level outputted from the comparator is changed from the first state to the second state and clock signal is changed from the high level to the low level. In response to the stop signal, the digital code generator suspends the up counting operation.

In an embodiment, each transistor-resistor array of the termination resistor includes a plurality of branch circuits connected in parallel, and each of the branch circuits includes a controllable switch and a resistor connected in series.

In an embodiment, the resistance of the controllable switch is one twentieth of the resistance of the branch circuit containing the controllable switch.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE INVENTION

The present invention will now be described more specifically with reference to the following embodiments. It is to be noted that the following descriptions of embodiments of this invention are presented herein for purpose of illustration and description only; it is not intended to be exhaustive or to be limited to the precise form disclosed.

Figure 1:
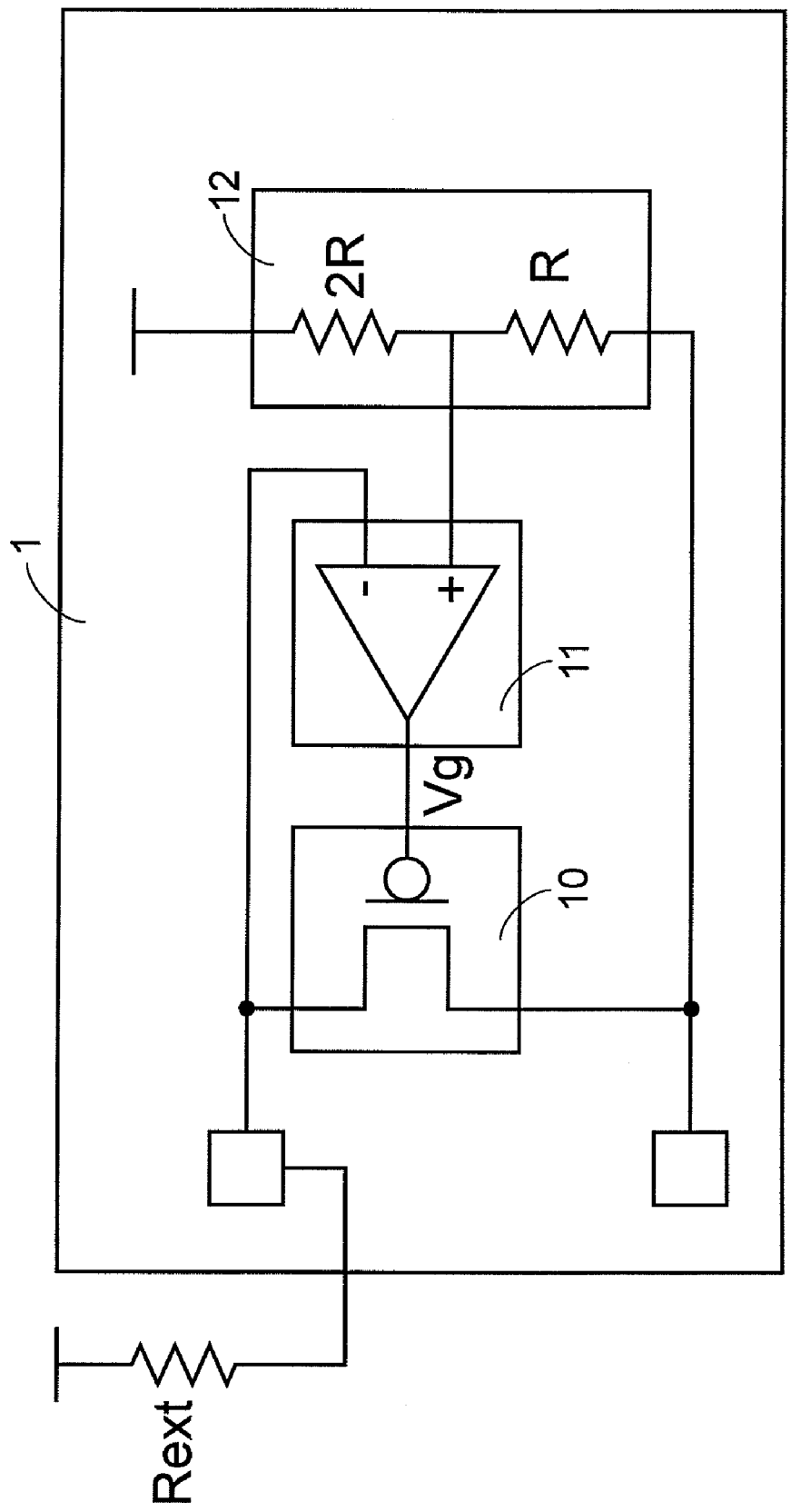
FIG. 1 is a schematic circuit diagram of a chip having an on-chip termination resistor implemented by an analog adjustment technology.
Figure 2:
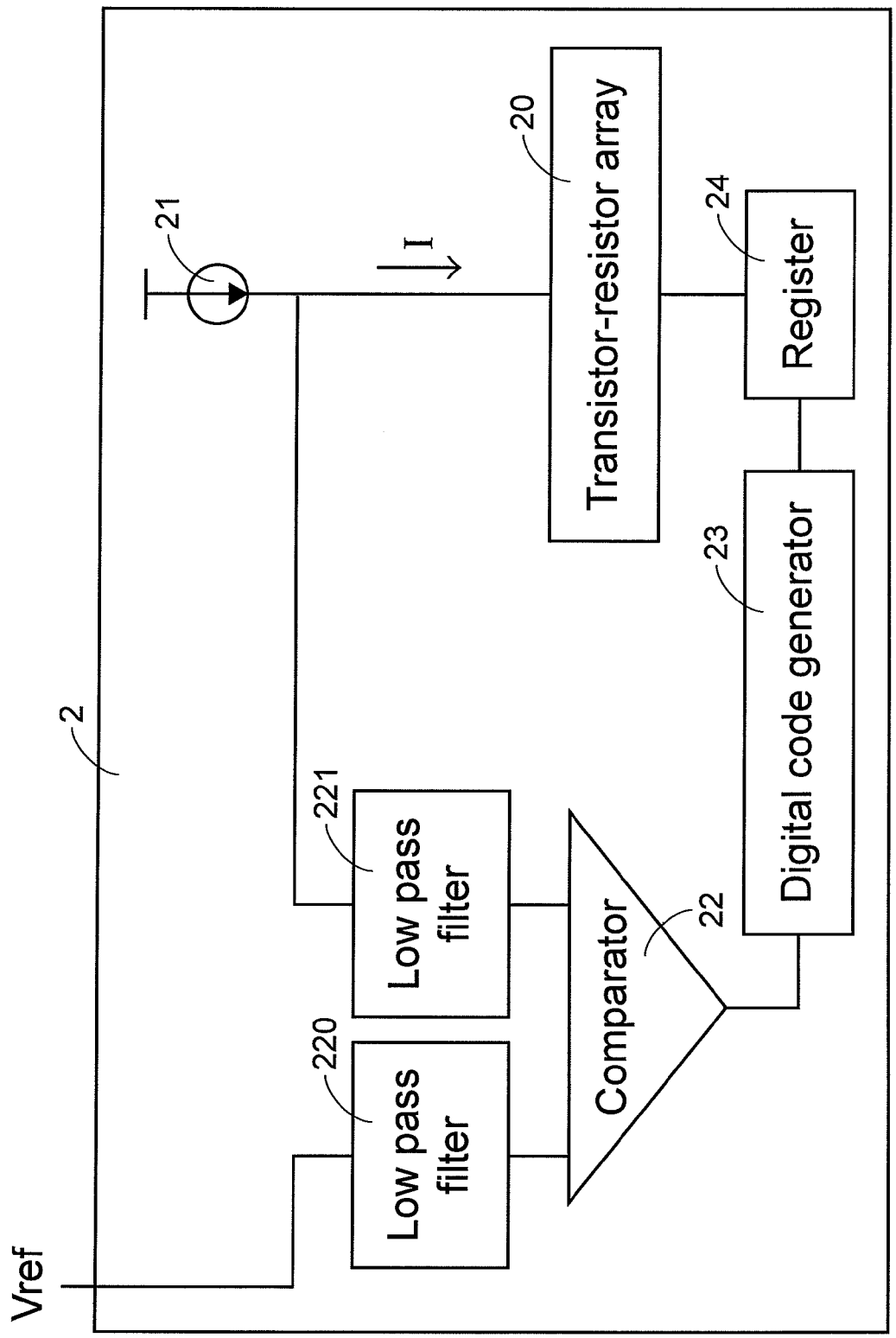
FIG. 2 is a schematic circuit diagram of a chip having an on-chip termination resistor implemented by a digital adjustment technology.
Figure 3:
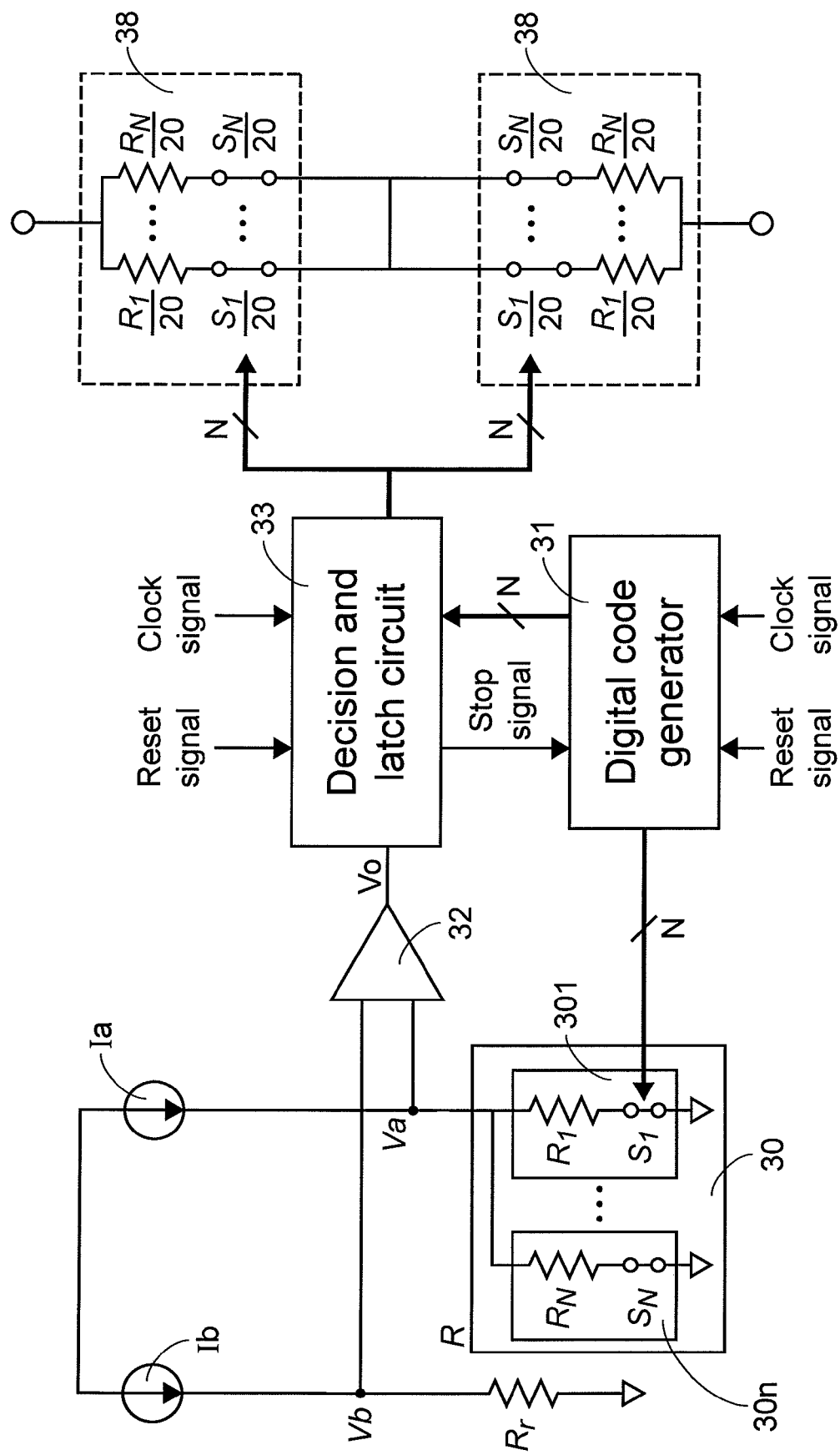
FIG. 3 is a schematic circuit diagram of an impedance adjustable circuit according to an embodiment of the present invention.

Referring to FIG. 3, a schematic circuit diagram of an impedance adjustable circuit according to an embodiment of the present invention is illustrated. The impedance adjustable circuit of FIG. 3 comprises a calibration transistor-resistor array 30 for calibration, a digital code generator 31, a comparator 32, a decision and latch circuit 33, and at least two transistor-resistor arrays 38 serving as termination resistors.

The present invention utilizes a bandgap voltage reference module (not shown), which is commonly used in the very large scale integrated circuits (VLSI), to generate the reference voltage without an extra constant current source and an extra external resistor.

Among the whole chip, the bandgap voltage reference module includes a most stable voltage source Vbg. Depending on the production process of the semiconductor, the reference voltage Vbg is a constant between about 1.2 and 1.25 volts. Moreover, the chip has an inherent internal resistance Rint (not shown) and an inherent external resistance Rext (not shown). According to the voltage source Vbg, the inherent internal resistance Rint and the inherent external resistance Rext, the bandgap voltage reference module will generate an internal current Iint and an external current Iext to be utilized by other circuitries in the chip. In some embodiments, the internal current Iint=Vbg/Rint, and the external current Iext=Vbg/Rext.

The constant current source used in the present invention is determined according to the internal current Iint and the external current Iext. In an embodiment, the internal current Iint is served as a first constant current source Ib. Since the first constant current source Ib is serially connected to a reference resistor Rr, a reference voltage Vb=Iint×Rr is obtained. In a case the resistance of the reference resistor Rr is equal to the inherent internal resistance Rint, the reference voltage Vb is equal to the voltage source Vbg. The second constant current source Ia is determined according to the current mirror circuit of the external current Iext. In an embodiment, the second constant current source Ia=K×Vbg/Rext, where K is a factor associated with the ratio of the external resistance Rext to the resistance R of the transistor-resistor array 30. For example, if the external resistance Rext is 6.2 kohms and the resistance R of the transistor-resistor array 30 is 1,000 ohms, the factor K of the current mirror circuit is set to 6.2.

Hereinafter, an embodiment of operating the impedance adjustable circuit will be illustrated as follows. First of all, in response to a global reset signal, the logic circuits including the digital code generator 31 and the decision and latch circuit 33 are reset. When the global reset signal is changed from a high voltage level to a low voltage level, the digital code generator 31 will generate an N-bit digital code to adjust the resistance R of the transistor-resistor array 30 to a minimum value. As a consequence, the comparing voltage Va across the transistor-resistor array 30 is reduced when the computer system is booted. The transistor-resistor array 30 includes a plurality of branch circuits 301~30n connected in parallel. Each of the branch circuits 301~30n includes a controllable switch ($S_1$~$S_N$) and a resistor ($R_1 \sim R_N$) connected in series. Alternatively, the digital code generator 31 generates $2^N$-bit of thermal codes or N-bit of binary codes. For generating the thermal codes, the digital code generator 31 includes $2^N$ counts of D-type flip-flops. Whereas, for generating the binary codes, the digital code generator 31 includes N counts of D-type flip-flops. The decision and latch circuit 33 comprises a latch circuit portion including $2^N$ or N counts of D-type flip-flops and a digital logic circuit portion including a plurality of logic gates.

Next, the global reset signal is changed from a low voltage level to a high voltage level, and the impedance adjustable circuit begins a series of adjusting operations. When the clock signal is at a high level, the digital code generator 31 will up count such that the resistance R of the transistor-resistor array 30 increases a unit resistance $\Delta R$ for each count. If the comparing voltage Va across the transistor-resistor array 30 is less than the reference voltage Vb, it is meant that the resistance R of the transistor-resistor array 30 is less than the target value, for example 1,000 ohms. Under this circumstance, the comparator 32 will output a low-level voltage. In response to the low-level voltage, the generated digital code will not be recorded into the decision and latch circuit 33, which is electrically connected to the output terminal of the comparator 32. When the digital code generator 31 up counts the digital code to a target value such that the comparing voltage Va is just greater than the reference voltage Vb, the comparator 32 will output a high-level voltage. Meanwhile, the input clock signal is changed from the high level to the low level. According to these two criteria, the decision and latch circuit 33 will record the target digital code therein while issuing a stop signal to the digital code generator 31. In response to the stop signal, the digital code generator 31 suspends up counting. Under this circumstance, the target digital code corresponding to the resistance R of the transistor-resistor array 30 is accessible to the computer system. Since Va=Ia×R and Ia=K×Vbg/Rext, a following equation is deduced: Vb=Vbg=K×Vbg×R/Rext. For example, if the external resistance Rext is 6.2 kohms and the factor K is 6.2, the target digital code corresponding to the resistance R (=1,000 ohms) of the transistor-resistor array 30 is used in the computer system.

In response to the target digital code issued from the decision and latch circuit 33, precise resistances of the transistor-resistor arrays 38, which are mounted on a high speed transceiver for serving as termination resistors, are determined. In accordance with a special feature of the present invention, the configuration of each transistor-resistor array 38 is substantial identical to that of the transistor-resistor array 30. Moreover, these at least two transistor-resistor arrays 38 are coupled with each other in parallel. In the embodiment of FIG. 3, twenty transistor-resistor arrays 38 are coupled with each other in parallel. In a case that the resistance R of the transistor-resistor array 30 is 1,000 ohms, the resistance of each transistor-resistor array 38 is decreased to 50 ohms, i.e. 1000/20=50. Likewise, each transistor-resistor array 38 includes a plurality of branch circuits connected in parallel, and each of the branch circuits includes a controllable switch and a resistor connected in series. Since twenty transistor-resistor arrays 38 are coupled with each other in parallel, the resistances of the controllable switch and the resistor are decreased to one twentieth of their original values. Therefore, the controllable switches are denoted as $S_1/20 \sim S_N/20$, and the resistors are denoted as $R_1/20 \sim R_N/20$ in the drawing. It is preferred that the resistance of the controllable switch is less than one twentieth of the resistor for each branch circuit.

From the above embodiments, the comparing voltage Va and the reference voltage Vb used in the impedance adjustable circuit of the present invention are determined according to the internal current Iint and the external current Iext. Due to the mismatch between the internal current Iint and the external current Iext, if the Iint or Iext increases or decreases a unit current $\Delta I$ to (Iint+$\Delta$Iint) or (Iext+$\Delta$Iext), Vb or Va will increase or decrease a unit voltage $\Delta V$ to (Vb+$\Delta$Vb) or (Va+$\Delta$Va).

By using the mismatch data of the 0.22 micron process provided by the TSMC (Taiwan Semiconductor Manufacturing Company), the evaluating results are shown as follows.

The input offset voltage of the comparator 32 is 1 mV (3σ). The ratio of the unit internal current $\Delta$Iint to the internal current Iint, i.e. $\Delta$Iint/Iint, is approximately equal to 0.2%×3=0.6% (3σ). The ratio of the unit resistance $\Delta R$ to the internal resistance R, i.e. $\Delta R$/Rint, is approximately equal to 0.5×0.3%×3=0.45% (3σ). As a result, the ratio of the unit voltage $\Delta$Vb to the reference voltage Vb, i.e. $\Delta$Vb/Vb, is approximately equal to $((0.6\%)^2+(0.45)^2)^{1/2}$=0.75% (9.4 mV). The ratio of the unit external current $\Delta$Iext to the external current Iext, i.e. $\Delta$Iext/Iext, is approximately equal to $6^{1/2}/6 \times 0.6\%$=0.25%. The ratio of the unit resistance $\Delta$Rext to the external resistance Rext, i.e. $\Delta$Rext/Rext, is approximately equal to $22^{1/2}/10 \times 1\% \times 3$=1.4%. As a result, the ration of the unit voltage $\Delta$Va to the comparing voltage Va, i.e. $\Delta$Va/Va, is approximately equal to $((1.4\%)^2+(0.25)^2)^{1/2}$=1.42% (17.7 mV). The total mismatch offset voltage is equal to $((1\ mV)^2+(9.4\ mV)^2+(17.7\ mV)^2)^{1/2}$=20.1 mV.

Since the external resistance Rext has a variation of about +/−5%, the comparing voltage Va also has a shift amount of about +/−5%. That is, 0.05×Vbg=0.05×1.25V=62.5 mV. As previously described, when the digital code generator 31 up counts, the resistance R of the transistor-resistor array 30 will increase a unit resistance $\Delta R$ for each count. Meanwhile, the comparing voltage Va may increased about 50 mV. Due to the total mismatch offset voltage and the shift amount resulting from the variation of the external resistance Rext, the digital code will be shifted to a previous one or a next one. In response to the previous or next digital code, the variation of the resistance is about +/−11%.

As previously described, the variation of the external resistance Rext and the total mismatch offset voltage may cause shift of the target digital code of the impedance adjustable circuit. For solving this problem, the increment of the comparing voltage Va between two consecutive digital codes should be greater than 200 mV. In such manner, the total current is quadruplicated, or the area of the transistor-resistor array is quadruplicated, or both of the total current and the area of the transistor-resistor array are doubled. That is, for reducing the variation of the termination resistance below 10%, the total current or the area of the transistor-resistor array should be increased. Alternatively, by increasing the resolution of the transistor-resistor array, the variation of the termination resistor can be further reduced.

From the above description, the application of the impedance adjustable circuit provided by the present invention is extensive and flexible because the resistance of the transistor-resistor array is adjustable to meet different specifications. In addition, since the off-chip termination resistor is exempted, the impedance adjustable circuit of the present invention is more cost-effective and more reliable. Since the transistor-resistor array has a better linear speed than the resistance Rmos of the MOS transistor 10, the resistance of the termination resistor is substantially unchanged when applied to the high speed transceiver. Moreover, since the current used in the present invention is about 1.2 mA, the power consumption is largely reduced. While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An impedance adjustable circuit having an on-chip adjustable termination resistor for use in an integrated circuit chip, the integrated circuit chip including a bandgap voltage reference module, the adjustable termination resistor comprising:
   a reference resistor coupled to the bandgap voltage reference module, wherein a reference voltage is determined according to the reference resistor and an internal current outputted from the bandgap voltage reference module;
   a current mirror circuit for generating a mirror current according to an external current outputted from the bandgap voltage reference module as a reference current and a factor;
   a calibration transistor-resistor array electrically connected to the current mirror circuit, wherein the mirror current flows through the calibration transistor-resistor array to result in a comparing voltage across the calibration transistor-resistor array;
   a digital code generator electrically connected to the calibration transistor-resistor array for generating and outputting a digital code to the calibration transistor-resistor array, wherein the resistance of the calibration transistor-resistor array is determined according to the digital code;
   a comparator having two input terminals electrically connected to the reference resistance and the calibration transistor-resistor array, wherein the voltage level outputted from the comparator is changed from a first state to a second state when the digital code generator up counts to a target digital code such that the comparing voltage is just greater than the reference voltage;
   a decision and latch circuit electrically connected to the comparator and the digital code generator for recording the target digital code therein; and
   a termination resistor electrically connected to the decision and latch circuit and including a plurality of transistor-resistor arrays connected in parallel, wherein the resistance of the termination resistor is adjustable according to the target digital code outputted from the decision and latch circuit.

2. The impedance adjustable circuit according to claim 1 wherein the resistance of the reference resistor is equal to that of an internal resistance of the bandgap voltage reference module.

3. The impedance adjustable circuit according to claim 1 wherein the factor for determining the current mirror circuit is a ratio of the resistance of an external resistor of the bandgap voltage reference module to the resistance of the calibration transistor-resistor array in response to the target digital code.

4. The operating method according to claim 1 wherein the calibration transistor-resistor array and each of the transistor-resistor arrays included in the termination resistor have identical structures.

5. The operating method according to claim 1 wherein the voltage level outputted from the comparator is changed from a low-level state to a high-level state when the comparing voltage is just greater than the reference voltage.

6. The operating method according to claim 1 wherein a clock signal is inputted into the decision and latch circuit.

7. The operating method according to claim 6 wherein the decision and latch circuit records the target digital code therein and issues a stop signal to the digital code generator when the voltage level outputted from the comparator is changed from the first state to the second state and clock signal is changed from the high level to the low level.

8. The operating method according to claim 7 wherein the digital code generator suspends the up counting operation in response to the stop signal.

9. The operating method according to claim 1 wherein each transistor-resistor array of the termination resistor includes a plurality of branch circuits connected in parallel, and each of the branch circuits includes a controllable switch and a resistor connected in series.

10. The operating method according to claim 9 wherein the resistance of the controllable switch is one twentieth of the resistance of the branch circuit containing the controllable switch.

* * * * *